United States Patent
Hsu et al.

(10) Patent No.: US 11,913,132 B2
(45) Date of Patent: Feb. 27, 2024

(54) METHOD FOR MANUFACTURING A PACKAGE

(71) Applicant: Advanced Semiconductor Engineering, Inc., Kaohsiung (TW)

(72) Inventors: Chia Chun Hsu, Kaohsiung (TW); Chin-Feng Wang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 17/747,981

(22) Filed: May 18, 2022

(65) Prior Publication Data

US 2023/0374689 A1 Nov. 23, 2023

(51) Int. Cl.
| | | |
|---|---|---|
| *C25D 5/18* | (2006.01) | |
| *C25D 7/12* | (2006.01) | |
| *C25D 5/08* | (2006.01) | |
| *H01L 23/00* | (2006.01) | |
| *H01L 21/56* | (2006.01) | |
| *C25D 5/00* | (2006.01) | |

(52) U.S. Cl.
CPC ............... *C25D 5/18* (2013.01); *C25D 5/007* (2020.08); *C25D 5/08* (2013.01); *C25D 7/12* (2013.01); *H01L 21/561* (2013.01); *H01L 21/568* (2013.01); *H01L 24/18* (2013.01); *H01L 24/96* (2013.01)

(58) Field of Classification Search
CPC ............ C25D 7/12–123; C25D 17/001; H01L 21/2885; H01L 21/76873; H01L 2224/11462
See application file for complete search history.

(56) References Cited

U.S. PATENT DOCUMENTS

| | | | | |
|---|---|---|---|---|
| 6,297,155 | B1 * | 10/2001 | Simpson | H01L 21/76877 257/E21.585 |
| 2002/0127829 | A1 * | 9/2002 | Marumo | H01L 21/2885 257/E21.175 |
| 2006/0011483 | A1 * | 1/2006 | Mayer | C25D 3/02 205/118 |
| 2008/0271992 | A1 * | 11/2008 | Dordi | C25D 7/123 204/224 R |
| 2009/0139871 | A1 * | 6/2009 | Saito | C25D 21/10 204/224 R |
| 2020/0157702 | A1 * | 5/2020 | Shimomura | H01L 21/2885 |
| 2020/0270760 | A1 * | 8/2020 | Nakagawa | C25D 21/12 |

OTHER PUBLICATIONS

Wu, Machine Translation & original, CN 106757294 A (Year: 2017).*
Takase et al., Original & Machine Translation, JP 2008-088522 A (Year: 2008).*

* cited by examiner

*Primary Examiner* — Hosung Chung
(74) *Attorney, Agent, or Firm* — FOLEY & LARDNER LLP

(57) ABSTRACT

A method for manufacturing a package includes generating an electric field between an anode and a cathode in an electroplating solution to electroplate a substrate electrically connected to the cathode; depositing metal on a central region of the substrate with a first deposition rate; depositing metal on an outer region of the substrate with a second deposition rate lower than the first deposition rate; and reducing the first deposition rate.

6 Claims, 23 Drawing Sheets

METHOD FOR MANUFACTURING A PACKAGE

BACKGROUND

1. Field of the Disclosure

The present disclosure relates to a manufacturing method, and to a manufacturing method used for manufacturing a package structure.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase. The circuit layers of semiconductor substrates are formed by electroplating. Thus, the uniformity of thickness of the plated circuit layers of the semiconductor substrates may a critical issue, and may affect a yield of the semiconductor substrate.

SUMMARY

In some embodiments, a method for manufacturing a package includes: generating an electric field between an anode and a cathode in an electroplating solution to electroplate a substrate electrically connected to the cathode; depositing metal on a central region of the substrate with a first deposition rate; depositing metal on an outer region of the substrate with a second deposition rate lower than the first deposition rate; and reducing the first deposition rate.

In some embodiments, a method for manufacturing a package includes: providing a substrate between a first electrode and a second electrode in an electroplating solution, wherein the electroplating solution includes a plurality of metal ions; and adjusting a first deposition path of a first portion of the plurality of metal ions from the first electrode to the substrate.

In some embodiments, a method for manufacturing a package includes: providing a substrate in an electroplating solution; and non-electrically adjusting a deposition rate of a plurality of metal ions of the electroplating solution on a portion of the substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
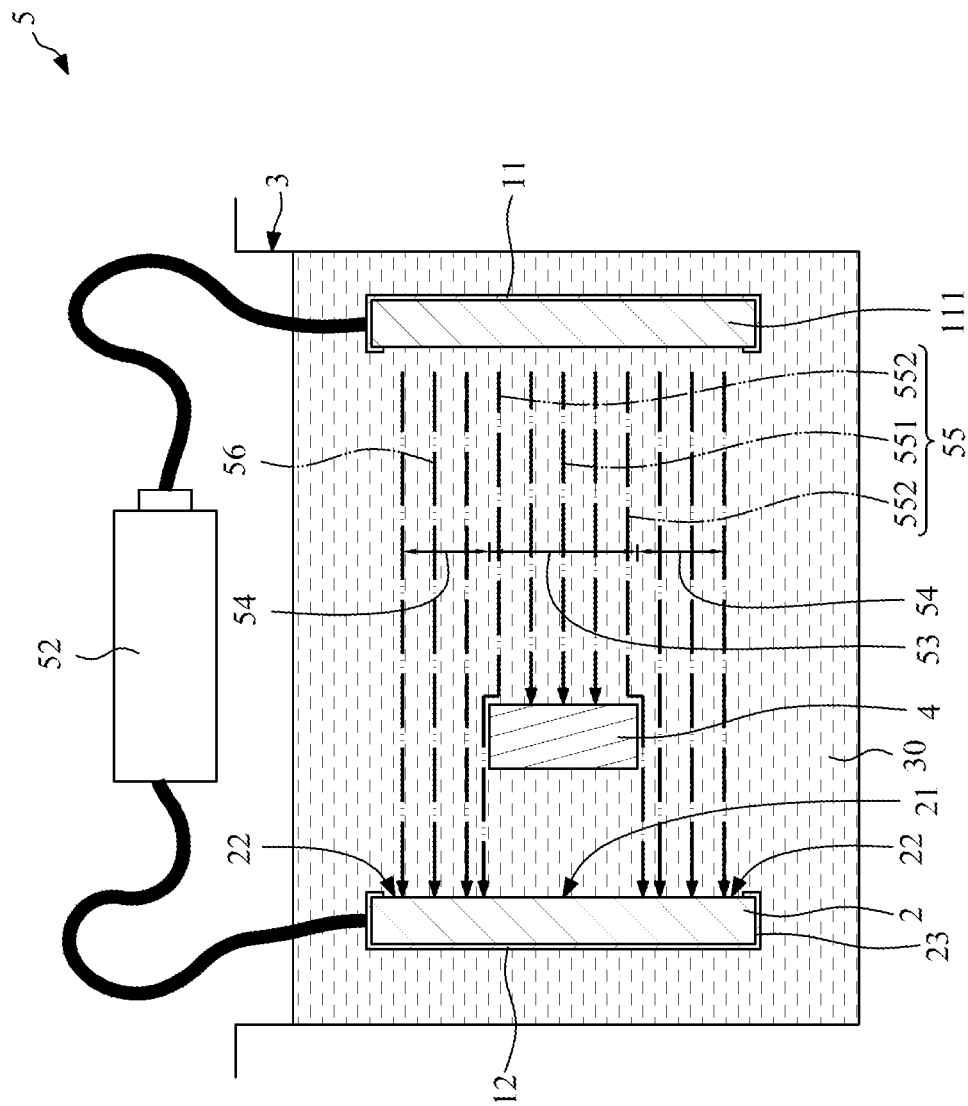
FIG. 1 illustrates a cross-sectional view of a plating apparatus according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
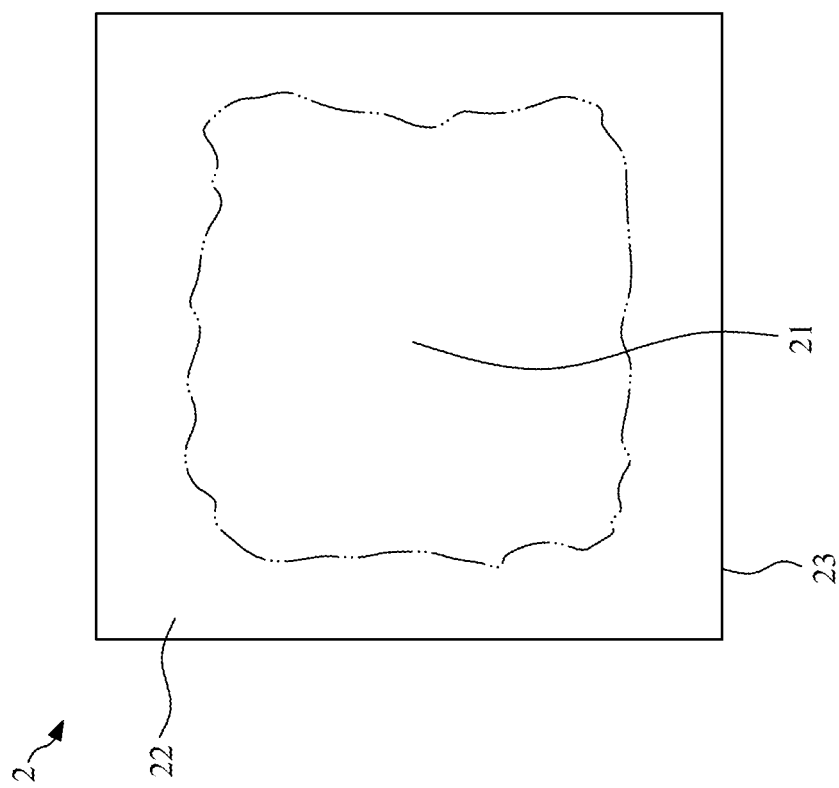
FIG. 2 illustrates a front view of the substrate of FIG. 1.
Figure 3:
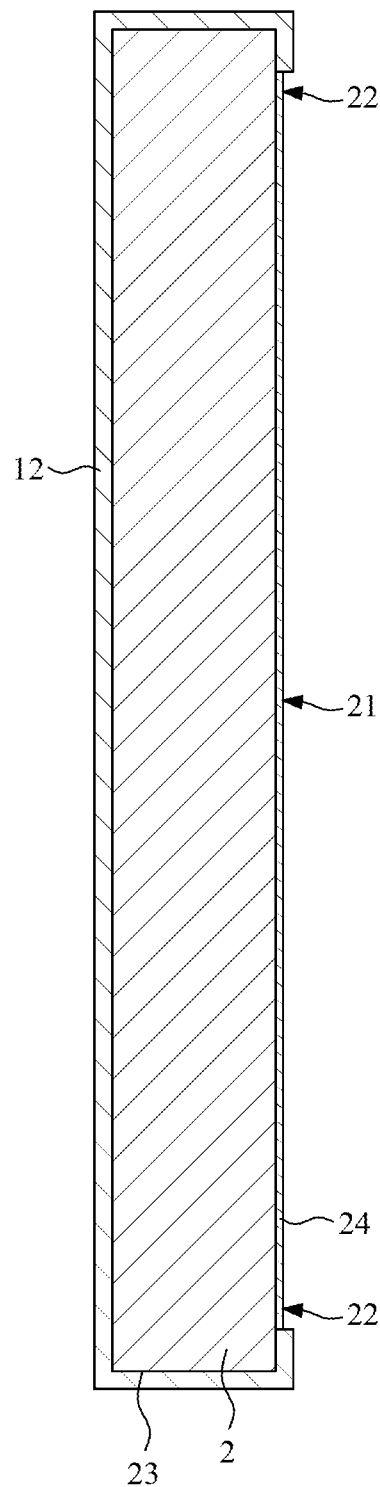
FIG. 3 illustrates an enlarged cross-sectional view of the substrate of FIG. 1.

FIG. 1 illustrates a cross-sectional view of a plating apparatus 5 according to some embodiments of the present disclosure. FIG. 2 illustrates a front view of the substrate 2 of FIG. 1. FIG. 3 illustrates an enlarged cross-sectional view of the substrate 2 of FIG. 1. In a method for manufacturing a package including a substrate, the circuit layer(s) of the substrate may be formed by an electroplating process accomplished in the plating apparatus 5. The plating apparatus 5 may include a tank 3, a first electrode 11, a second electrode 12, a substrate 2, a deposition control apparatus 4 and a power supply 52.

The tank 3 may accommodate an electroplating solution 30 (e.g., an electroplating bath or an electrolyte). The electroplating solution 30 (e.g., electroplating bath or electrolyte) may include a plurality of metal ions (e.g., copper ions). The first electrode 11 (e.g., anode) may be disposed in the electroplating solution 30. In some embodiments, the first electrode 11 (e.g., anode) may be a soluble anode, and may be electrically connected to an ion source material 111 (including, for example, copper) that dissolves and replenishes the solution 30 (e.g., electroplating bath) during the electroplating process. In some embodiments, the first electrode 11 (e.g., anode) may be an insoluble anode (including, for example, platinum).

The second electrode 12 (e.g., cathode) may be disposed in the electroplating solution 30. The second electrode 12 may include the substrate 2. The substrate 2 may be disposed on the second electrode 12. The substrate 2 may be physically connected and electrically connected to the second electrode 12, and may be the object or the target to be electroplated. In some embodiments, the substrate 2 may be provided between the first electrode 11 (e.g., anode) and the second electrode 12 (e.g., cathode) in an electroplating solution 30. The substrate 2 may be a semiconductor substrate such as a FR4 substrate. As shown in FIG. 2, the substrate 2 may be in a panel type, and may be clamped by the second electrode 12. The substrate 2 may include a central portion 21 and an outer portion 22 around or surrounding the central portion 21. As shown in FIG. 3, a plated layer 24 may be formed on a surface of the substrate 2 after the electroplating process.

The deposition control apparatus 4 may be disposed in the electroplating solution 30 and between the first electrode 11 (e.g., anode) and the second electrode 12 (e.g., cathode). In some embodiments, the deposition control apparatus 4 may be closer to the second electrode 12 (e.g., cathode) than to the first electrode 11 (e.g., anode). The deposition control apparatus 4 may be configured to control or adjust a deposition rate of the plurality of metal ions of the electroplating solution 30 deposited on the substrate 2 on the second electrode 12 (e.g., cathode). Thus, the deposition control apparatus 4 may be configured to control or adjust the growth rate of the plated layer 24 at different regions of the substrate 2. As shown in FIG. 1, the deposition control apparatus 4 may be a blocker consisted of an insulation material.

The power supply 52 may electrically connect the first electrode 11 (e.g., anode) and the second electrode 12 (e.g., cathode) so as to supply an electroplating current that may be conducted between the first electrode 11 (e.g., anode) and the second electrode 12 (e.g., cathode) in the electroplating solution 30. When the power supply 52 is turned on, the metal ions in the electroplating solution 30 may move from the first electrode 11 (e.g., anode) to the second electrode 12 (e.g., cathode).

In an electroplating process for forming a circuit layer of the substrate 2, an electric field may be generated between the first electrode 11 (e.g., anode) and the second electrode 12 (e.g., cathode) in the electroplating solution 30 to electroplate the substrate 2 electrically connected to the second electrode 12 (e.g., cathode). In some embodiments, the plurality of metal ions of the electroplating solution 30 may be deposited on the central portion 21 of the substrate 2 at a first deposition rate. That is, metal is deposited on the central region 21 of the substrate 2 with the first deposition rate. The plurality of metal ions of the electroplating solution 30 may be deposited on the outer portion 22 of the substrate 2 at a second deposition rate. That is, metal is deposited on the outer region 22 of the substrate 2 with the second deposition rate. The first deposition rate may be different from the second deposition rate due to the circuit layer embedded in the substrate 2. That is, the circuit layer embedded in the substrate 2 may influence the distribution of the electric field, for example, a first electric charge density of the electric field on the central portion 21 of the substrate 2 may be greater than a second electric charge density of the electric field on the outer portion 22 of the substrate 2, which may result in a non-uniform deposition rate at different regions of the substrate 2. In other words, an intensity of the electric field on the central portion 21 of the substrate 2 may be greater than an intensity of the electric field on the outer portion 22 of the substrate 2. Thus, the plated layer 24 may grow non-uniformly at different regions of the substrate 2. For example, the second deposition rate may be lower than the first deposition rate. The growth rate of the plated layer 24 on the central portion 21 of the substrate 2 may be greater than the growth rate of the plated layer 24 on the outer portion 22 of the substrate 2. If a non-uniform thickness of the plated layer 24 is formed, the yield rate of the substrate 2 is reduced.

To address such concerns, the first deposition rate may be reduced or lowered by providing a barrier (e.g., the deposition control apparatus 4) disposed in the electroplating solution 30 and between the first electrode 11 (e.g., anode) and the second electrode 12 (e.g., cathode). Alternatively, the second deposition rate may be increased. In some embodiments, the barrier (e.g., the deposition control apparatus 4) may be closer to the second electrode 12 (e.g., cathode) than to the first electrode 11 (e.g., anode). Alternatively, the first deposition rate may be reduced or lowered to be substantially equal to the increased second deposition rate. A difference between the first deposition rate and the second deposition rate may be reduced to zero.

In some embodiments, a location of the barrier (e.g., the deposition control apparatus 4) may correspond to a location of the central portion 21 of the substrate 2. Alternatively, the location of the (e.g., the deposition control apparatus 4) may change periodically or intermittently. A projection area of the barrier (e.g., the deposition control apparatus 4) on the substrate 2 on the second electrode 12 (e.g., cathode) may be adjustable. Further, the projection area of the barrier (e.g., the deposition apparatus 4) on the substrate 2 on the second electrode 12 (e.g., cathode) may correspond to an area of the central portion 21 of the substrate 2. Thus, a first deposition path 53 from the first electrode 11 (e.g., anode) to the central portion 21 of the substrate 2 may be blocked or barred, and a second deposition path 54 from the first electrode 11 (e.g., anode) to the outer portion 22 of the substrate 2 may be free of blocking or barring. The first deposition path 53 may be defined as a path along a direction from the first electrode 11 (e.g., anode) to the central portion 21 of the substrate 2. Alternatively, the first deposition path 53 may be a path of a central portion 55 (e.g., a first portion) of the plurality of metal ions from the first electrode 11 (e.g., anode) to the central portion 21 of the substrate 2. The second deposition path 54 may be defined as a direction or path from the first electrode 11 (e.g., anode) to the outer portion 22 of the substrate 2. Alternatively, the second deposition path 54 may be a path of an outer portion 56 (e.g., a second portion) of the plurality of metal ions from the first electrode 11 (e.g., anode) to the outer portion 22 of the substrate 2. The second deposition path 54 may be different from the first deposition path 53. The second deposition path 54 may be closer to a lateral surface 23 of the substrate 2 than the first deposition path 53 is.

Since the barrier (e.g., the deposition control apparatus 4) may be consisted of an insulation material, an electric resistance between the first electrode 11 (e.g., anode) and the central portion 21 of the substrate 2 may increase. Thus, the first electric charge density of the electric field on the central portion 21 of the substrate 2 (e.g., the first electric charge density of the electric field between the central portion 21 of the substrate 2) may be reduced or lowered. In some embodiments, the first electric charge density of the electric field on the central portion 21 of the substrate 2 may be reduced to be substantially equal to the second electric charge density of the electric field on the outer portion 22 of the substrate 2 (e.g., the second electric charge density of the electric field between the outer portion 22 of the substrate 2). Alternatively, the intensity of the electric field on the central portion 21 of the substrate 2 may be reduced to be substantially equal to the intensity of the electric field on the outer portion 22 of the substrate 2.

As shown in FIG. 1, the plurality of metal ions of the electroplating solution 30 may include a central portion 55 (e.g., a first portion) and an outer portion 56 (e.g., a second portion). The central portion 55 of the metal ions may be located in the first deposition path 53, and may move from the first electrode 11 (e.g., anode) toward the central portion 21 of the substrate 2. The central portion 55 may include an inner portion 551 (e.g., a first portion) and an outer portion 552 (e.g., a second portion) surrounding the inner portion 551. The outer portion 56 of the metal ions may be located in the second deposition path 54, and may move from the first electrode 11 (e.g., anode) toward the outer portion 22 of the substrate 2.

The barrier (e.g., the deposition control apparatus 4) may bar or block the central portion 55 of the metal ions from depositing toward the central portion 21 of the substrate 2. Thus, the metal may be barred to deposit on the central portion 21 of the substrate 2. In some embodiments, the inner portion 551 of the central portion 55 of the metal ions may be barred or blocked from moving to the central portion 21 of the substrate 2. The outer portion 552 (e.g., second portion) of the central portion 55 of the metal ions may be guided to the outer portion 56 of the metal ions. That is, the outer portion 552 (e.g., second portion) of the central portion 55 moving toward the central portion 21 of the substrate 2 may be guided to be moved to the outer portion 56 of the substrate 2. Alternatively, the outer portion 552 (e.g., second portion) of the central portion 55 in or along the first deposition path 53 may be guided to the second deposition path 54. A periphery concentration of the outer portion 56 of the metal ions may be greater than a central concentration of the central portion 55 of the metal ions. Thus, the outer portion 552 (e.g., second portion) of the central portion 55 of the metal ions may be guided to deposit on the outer portion 22 of the substrate 2 to increase the second deposition rate.

As shown in FIG. 1, a moving trace of the outer portion 552 (e.g., second portion) of the central portion 55 of the metal ions within the first deposition path 53 may be changed to the second deposition path 54. That is, the first deposition path 53 may be adjusted. A deposition rate of the first deposition path 53 may be reduced. In some embodiments, the central portion 55 of the metal ions may be selectively decreased to deposit on the central portion 21 of the substrate 2. The central portion 55 of the metal ions may be periodically or intermittently barred or blocked. That is, barring depositing the metal on the central portion 21 of the substrate 2 is performed periodically or intermittently. In some embodiments, during the electroplating process, if a relatively thick thickness of the plated layer 24 on a region of the substrate 2 is detected, barring depositing the metal on the central portion 21 of the substrate 2 is performed at a location corresponding to such region of the substrate 2. When the thickness of the plated layer 24 on such region of the substrate 2 is substantially consistent with a thickness of the plated layer 24 on other region of the substrate 2, the barring may be released.

In some embodiments, the central portion 55 of the metal ions within the first deposition path 53 from the first electrode 11 (e.g., anode) to the central portion 21 of the substrate 2 may be adjusted or controlled. For example, a movement of the central portion 55 of the metal ions within the first deposition path 53 may be slowed down. For example, the central portion 55 of the metal ions within the first deposition path 53 may be diverged. For example, the central portion 55 of the metal ions within the first deposition path 53 may be barred or blocked from moving toward the substrate 2. For example, the central portion 55 of the metal ions within the first deposition path 53 may be selectively decreased from moving toward the substrate 2. That is, the first deposition path 53 may be barred to reduce the central portion 55 (e.g., first portion) of the plurality of metal ions from moving toward the substrate 2. Therefore, the first deposition rate of the first deposition path 53 of the central portion 55 (e.g., a first portion) of the plurality of metal ions may be adjusted or reduced to be substantially equal to the second deposition rate of the second deposition path 54 of the outer portion 56 (e.g., a second portion) of the plurality of metal ions.

By reducing the first deposition rate or adjusting the central portion 55 of the metal ions within the first deposition path 53, the plated layer 24 on the substrate 2 may grow uniformly at different regions of the substrate 2. Thus, the plated layer 24 on the substrate 2 may have a substantially consistent thickness after the electroplating process.

Figure 4:
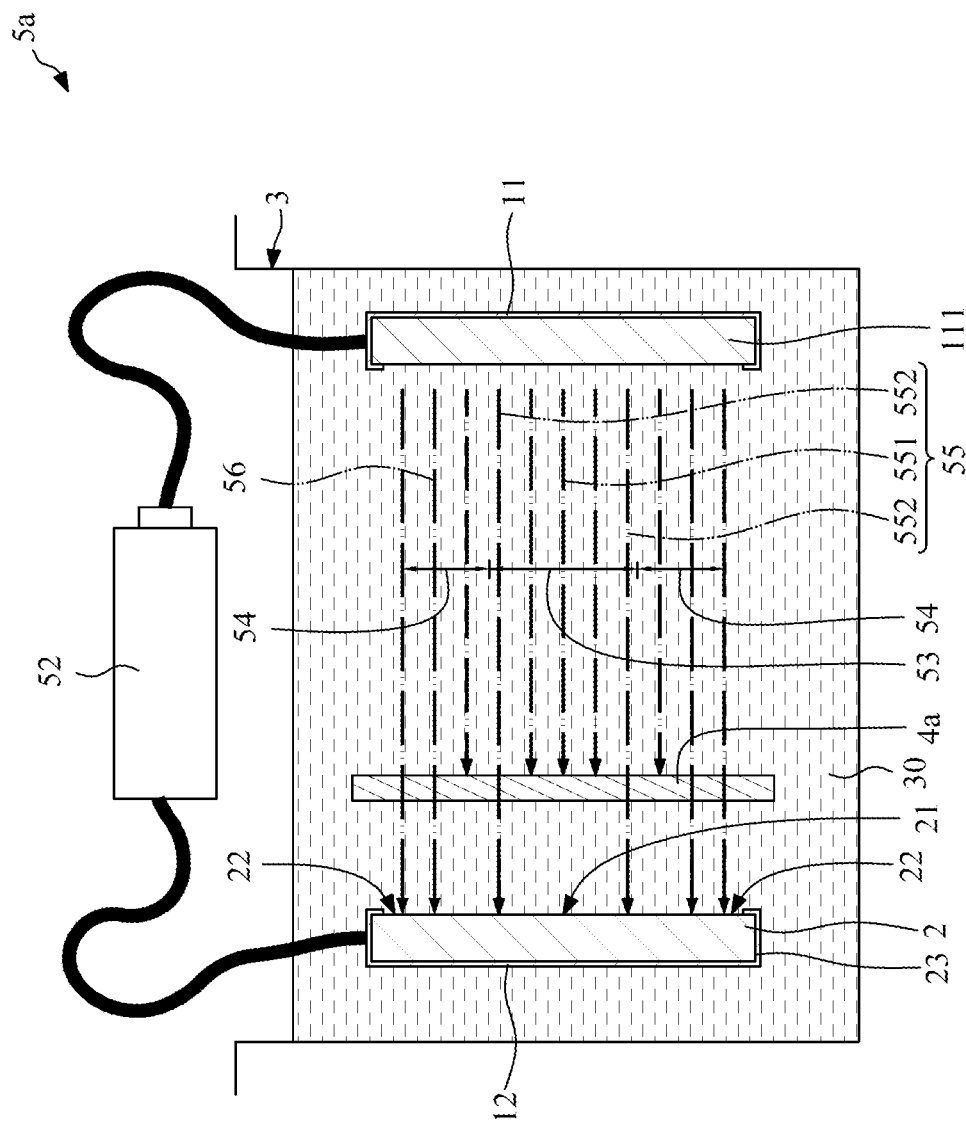
FIG. 4 illustrates a cross-sectional view of a plating apparatus according to some embodiments of the present disclosure.
Figure 5:
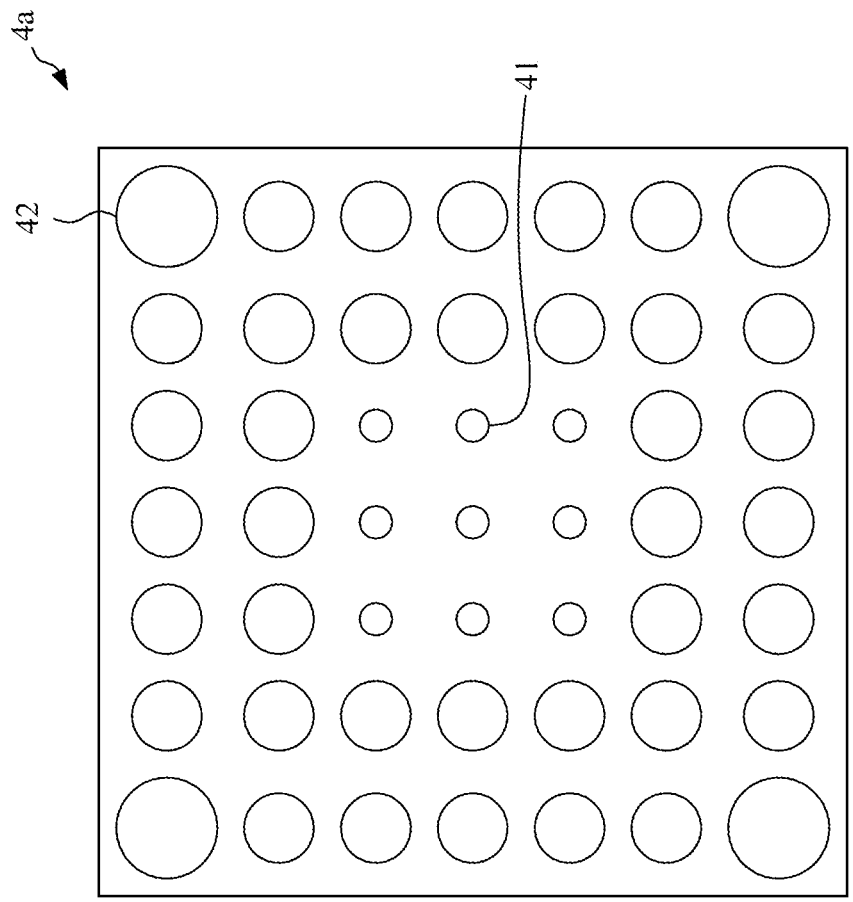
FIG. 5 illustrates a front view of the deposition control apparatus of FIG. 4.

FIG. 4 illustrates a cross-sectional view of a plating apparatus 5a according to some embodiments of the present disclosure. FIG. 5 illustrates a front view of the deposition control apparatus 4a of FIG. 4. The plating apparatus 5a of FIG. 4 may be similar to the plating apparatus 5 of FIG. 1, except for a structure of the deposition control apparatus 4a. The deposition control apparatus 4a of FIG. 4 may be a plate consisted of an insulation material, and may define a plurality of through holes (including a plurality of first through holes 41 and a plurality of second through holes 42) extending through the deposition control apparatus 4a as shown in FIG. 5. The locations of the first through holes 41 may correspond to the central portion 21 of the substrate 2 or may correspond to the first deposition path 53. The locations of the second through holes 42 may correspond to the outer portion 22 of the substrate 2 or may correspond to the second deposition path 54. A diameter of the first through hole 41 may be less than a diameter of the second through hole 42. A spacing between the first through holes 41 may be less than a spacing between the second through holes 42. Thus, a large proportion of the central portion 55 of the metal ions within the first deposition path 53 may be barred or blocked, and only a small proportion of the central portion 55 of the metal ions within the first deposition path 53 may pass through the first through holes 41. Further, a large proportion of the outer portion 56 of the metal ions within the second deposition path 54 may pass through the second through holes 42, and only a small proportion of the outer portion 56 of the metal ions within the second deposition path 54 may be barred or blocked.

Figure 6:
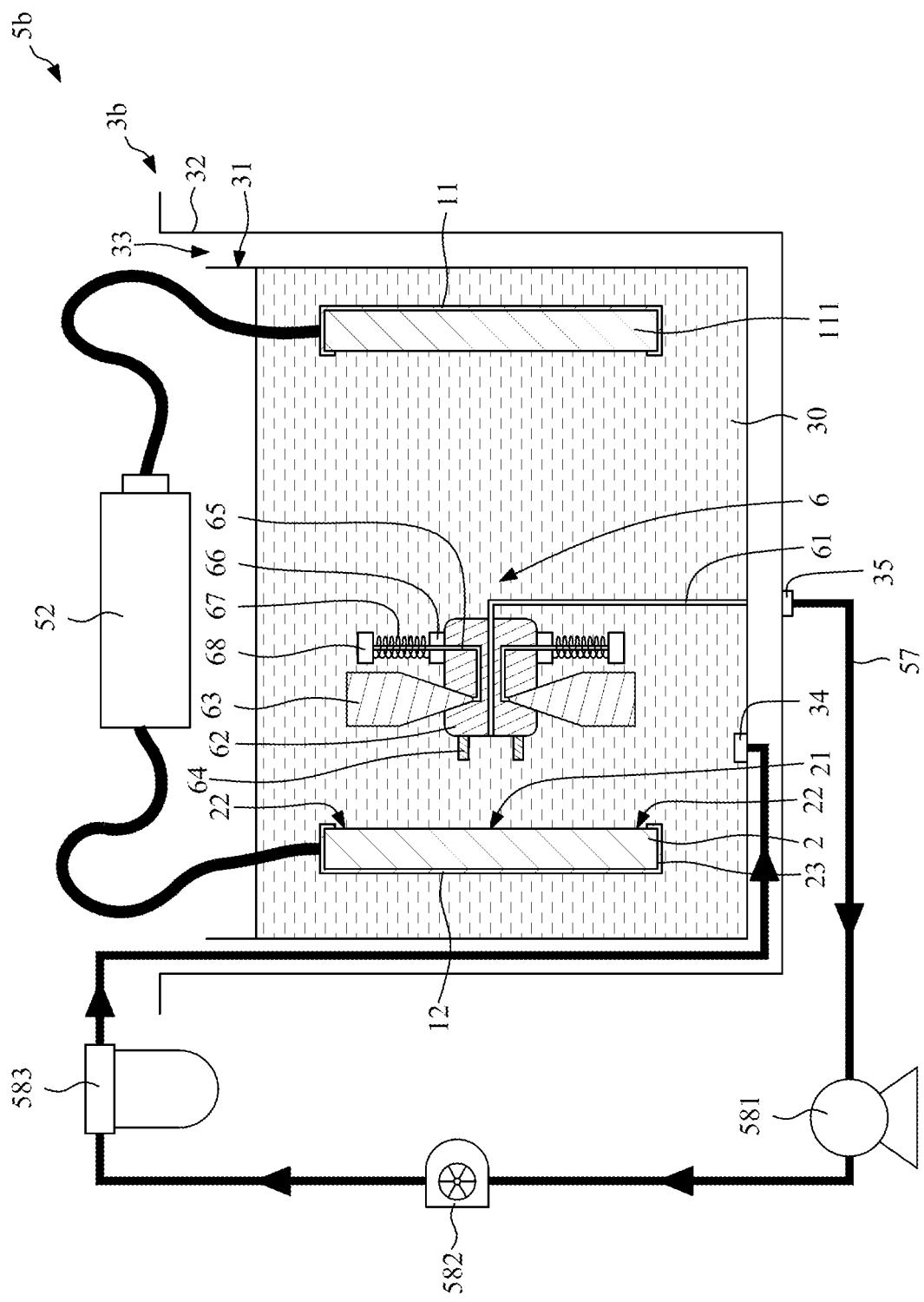
FIG. 6 illustrates a cross-sectional view of a plating apparatus according to some embodiments of the present disclosure.
Figure 7:
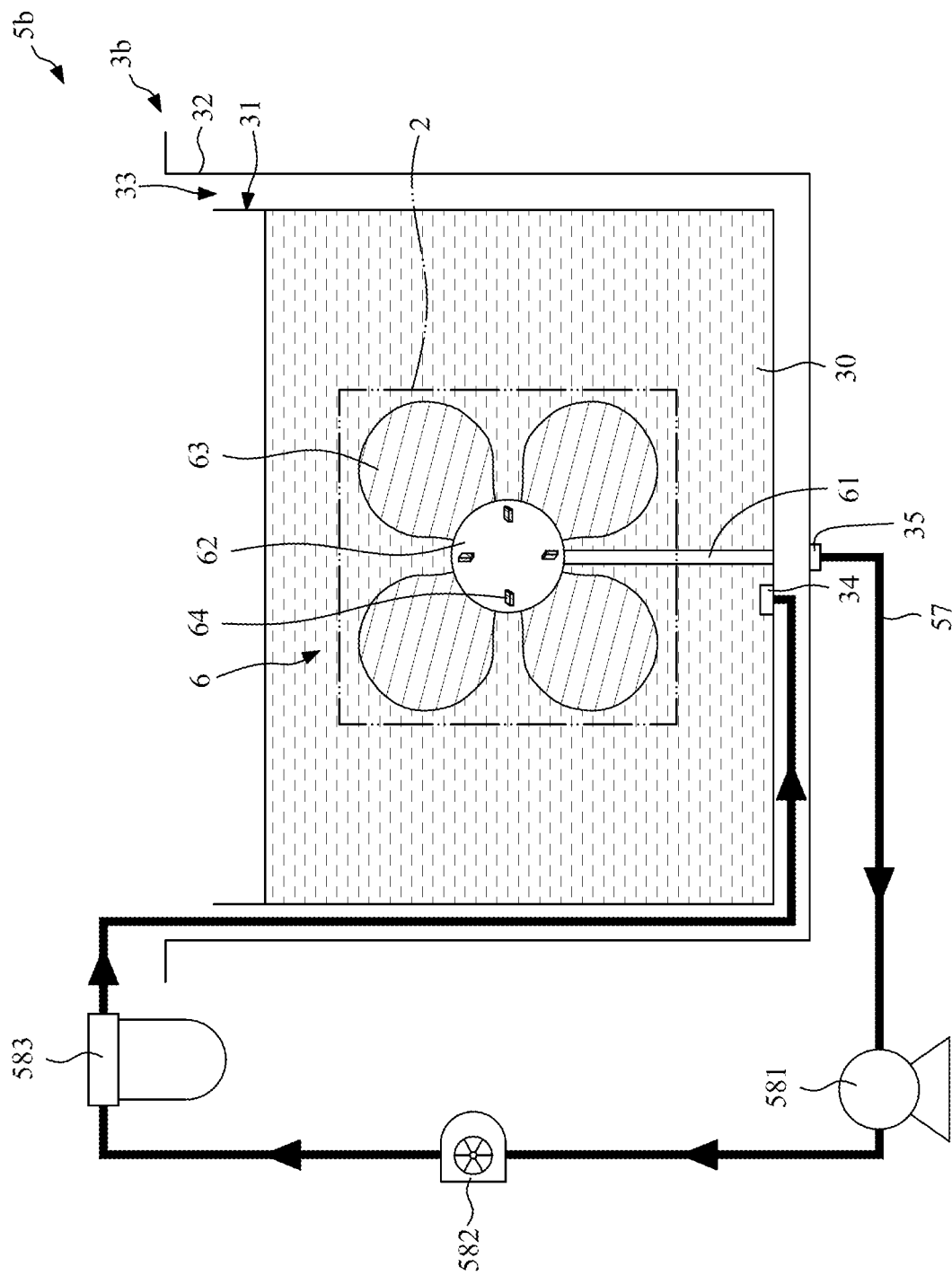
FIG. 7 illustrates a front view of the deposition control apparatus of FIG. 6.

FIG. 6 illustrates a cross-sectional view of a plating apparatus 5b according to some embodiments of the present disclosure. FIG. 7 illustrates a front view of the deposition control apparatus 6 of FIG. 6. The plating apparatus 5b of FIG. 6 may be similar to the plating apparatus 5 of FIG. 1, except for a structure of the deposition control apparatus 6 and a structure of the tank 3b. The tank 3b may include an inner wall 31 and an outer wall 32. The inner wall 31 may define a cavity for accommodating the electroplating solution 30. The outer wall 32 may define a cavity for accommodating the inner wall 31. A gap 33 may be formed between the outer wall 32 and the inner wall 31. The gap 33 may accommodate a portion of the electroplating solution 30 overflowing from the top edge of the inner wall 31.

In addition, the tank 3b may further include an inlet 34 connecting to the inner wall 31 and an outlet 35 connecting to the outer wall 32. The plating apparatus 5b may further include a recycling pipe 57, a pump 581, a flow sensor 582 and a filter 583. The recycling pipe 57 may connect the outlet 35, the pump 581, the flow sensor 582, the filter 583 and the inlet 34. The pump 581, the flow sensor 582, the filter 583 and a portion of the recycling pipe 57 may be disposed outside the outer wall 32. Another portion of the recycling pipe 57 may be disposed in the gap 33. Thus, the electroplating solution 30 may overflow to the gap 33 and enter the recycling pipe 57 through the outlet 35. Then, the electroplating solution 30 in the recycling pipe 57 may be pressed or pumped to enter the cavity defined by the inner wall 31 through the pump 581, the flow sensor 582, the filter 583 and the inlet 34. Thus, a recycling loop may be formed.

The deposition control apparatus 6 (e.g., an adjustment element) may be configured to adjust the deposition rate, and may include an insulation material, and may include a fixed bar 61, a rotatable head 62, at least one fan 63, a plurality of protrusions 64, at least one connecting wire 65, at least one fixed pad 66, an elastic mechanism 67 and a movable pad 68. One end of the fixed bar 61 may be connected to the inner wall 31, and the other end of the fixed bar 61 may insert into the rotatable head 62 for supporting the rotatable head 62. The protrusions 64 may protrude from a front surface of the rotatable head 62. For example, the protrusions 64 may be fixed on the front surface of the rotatable head 62. The fan 63 may be separated from the rotatable head 62. That is, the fan 63 may not be fixed to the rotatable head 62.

The fixed pad 66 may be fixed on a lateral surface of the rotatable head 62. The movable pad 68 may be connected to the fixed pad 66 through the elastic mechanism 67. The elastic mechanism 67 may be used for controlling a movement of the fan 63. For example, the elastic mechanism 67 may be a spring or an elastic body. The connecting wire 65 may be disposed in the rotatable head 62. One end of the connecting wire 65 may connect one end of the fan 63. The other end of the connecting wire 65 may pass through the fixed pad 66 and the elastic mechanism 67, and may connect the movable pad 68.

As shown in FIG. 6 and FIG. 7, the deposition control apparatus 6 is in a stationary state. The elastic mechanism 67 may be uncompressed, and the fan 63 may be pulled toward the rotatable head 62. In some embodiments, one end of the fan 63 may be disposed in a recess of the rotatable head 62.

Figure 8:
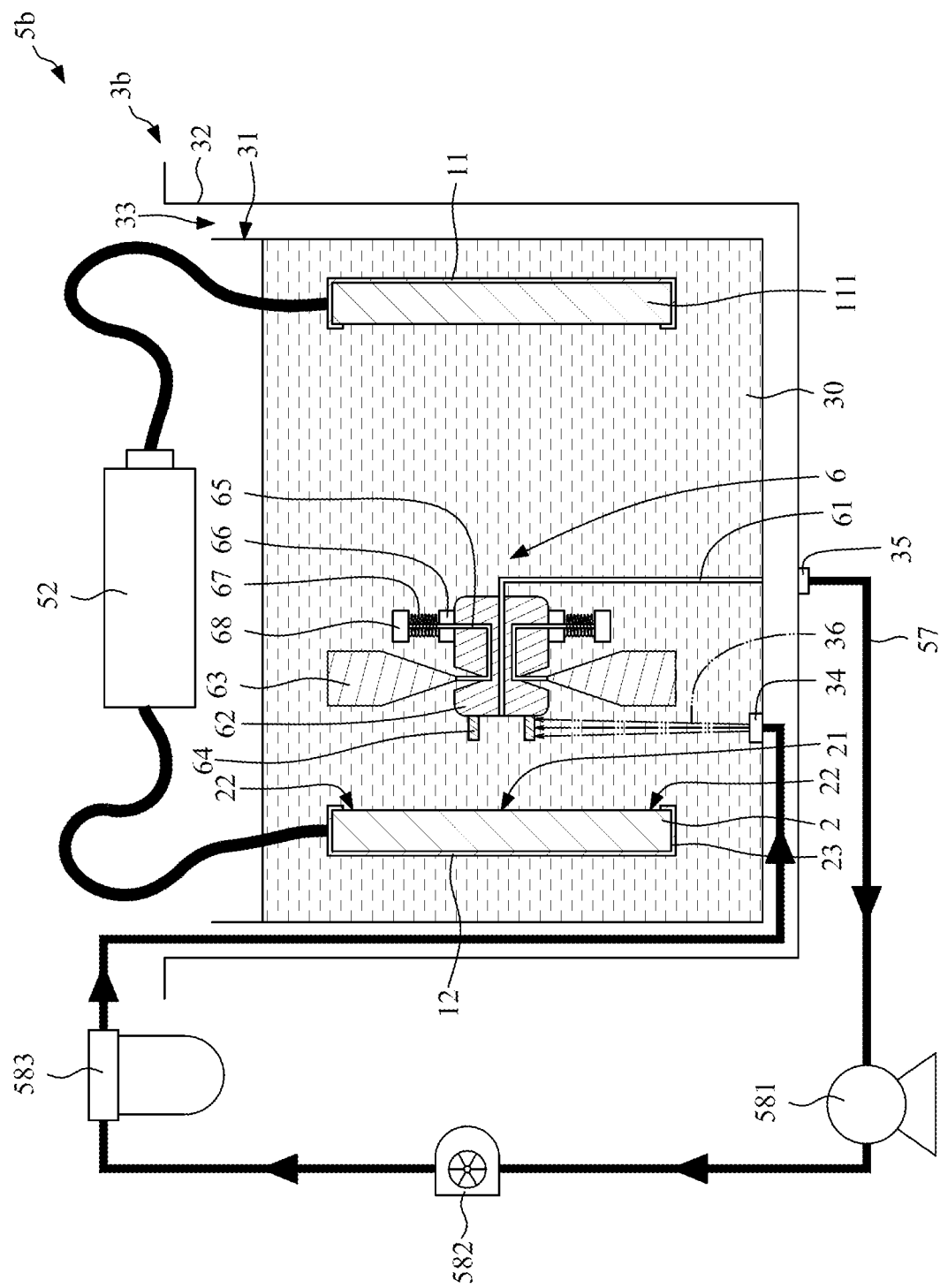
FIG. 8 illustrates a cross-sectional view of the plating apparatus of FIG. 6 in a rotating state.
Figure 9:
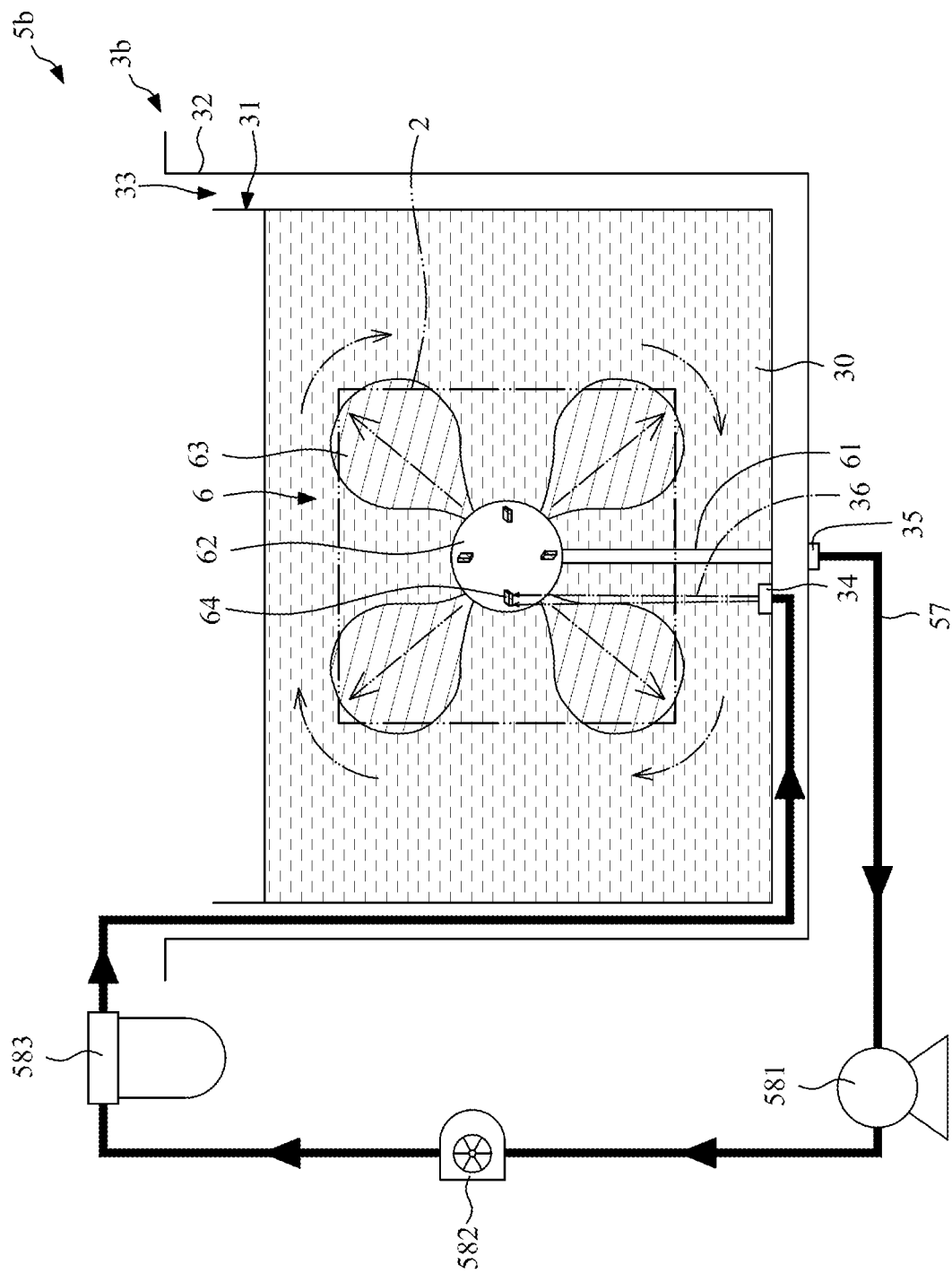
FIG. 9 illustrates a front view of the deposition control apparatus of FIG. 8.

FIG. 8 illustrates a cross-sectional view of the plating apparatus 5b of FIG. 6 in a rotating state. FIG. 9 illustrates a front view of the deposition control apparatus 6 of FIG. 8. When the electroplating solution 30 in the recycling pipe 57 is pressed or pumped to enter the cavity defined by the inner wall 31 through the pump 581, the flow sensor 582, the filter 583 and the inlet 34, a local flow 36 may be formed vertically from the inlet 34 to the protrusion(s) 64. The local flow 36 may press the protrusion(s) 64 so as to drive the rotatable head 62 to rotate. When the rotatable head 62 rotates, the fan 63 may move outward along a direction parallel with a surface of the substrate 2 or the second electrode 12 (e.g., cathode) due to the centrifugal force. Thus, the fan 63 is moveable along a direction parallel with a surface of substrate 2 or the second electrode 12 (e.g., cathode).

Meanwhile, an inward force is applied on the movable pad 68 to drive the movable pad 68 to move toward the rotatable head 62 through connecting wire 65 to press the elastic mechanism 67, an elastic potential energy is stored in the pressed elastic mechanism 52. Meanwhile, the fan 63 may rotate with the rotatable head 62. Thus, the deposition control apparatus 6 may be drove by non-electrical means such as the local flow 36 of the electroplating solution 31. Thus, a deposition rate of the plurality of metal ions of the electroplating solution 30 on a portion of the substrate 2 may be adjusted non-electrically. A projection area of the deposition control apparatus 6 on the substrate 2 on the second electrode 12 (e.g., cathode) may be adjustable. In some embodiments, the local flow 36 may drive the deposition control apparatus 6 periodically or intermittently.

Therefore, the deposition rate of plurality of metal ions of the electroplating solution 30 on the portion of the substrate 2 may be adjusted by the fan 63 non-electrically or by non-electrical means such as the local flow 36. The deposition control apparatus 6 (e.g., an adjustment element) may be drove by the local flow 36. In addition, the local flow 36 and the fan 63 may stir the electroplating solution 30, so as to mix the electroplating solution 30 uniformly, which increase the uniformity of the plated layer 24 during the plating process.

Figure 10:
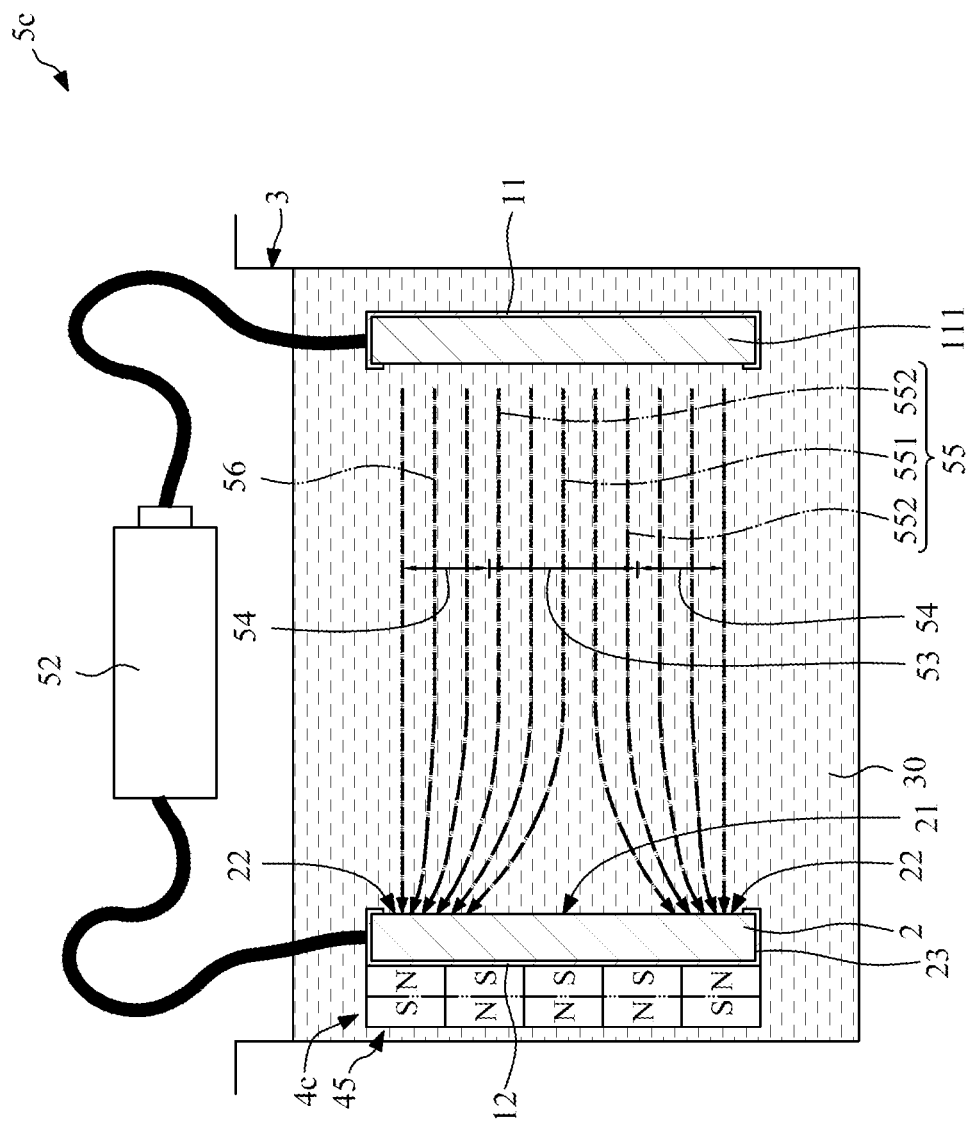
FIG. 10 illustrates a cross-sectional view of a plating apparatus according to some embodiments of the present disclosure.
Figure 11:
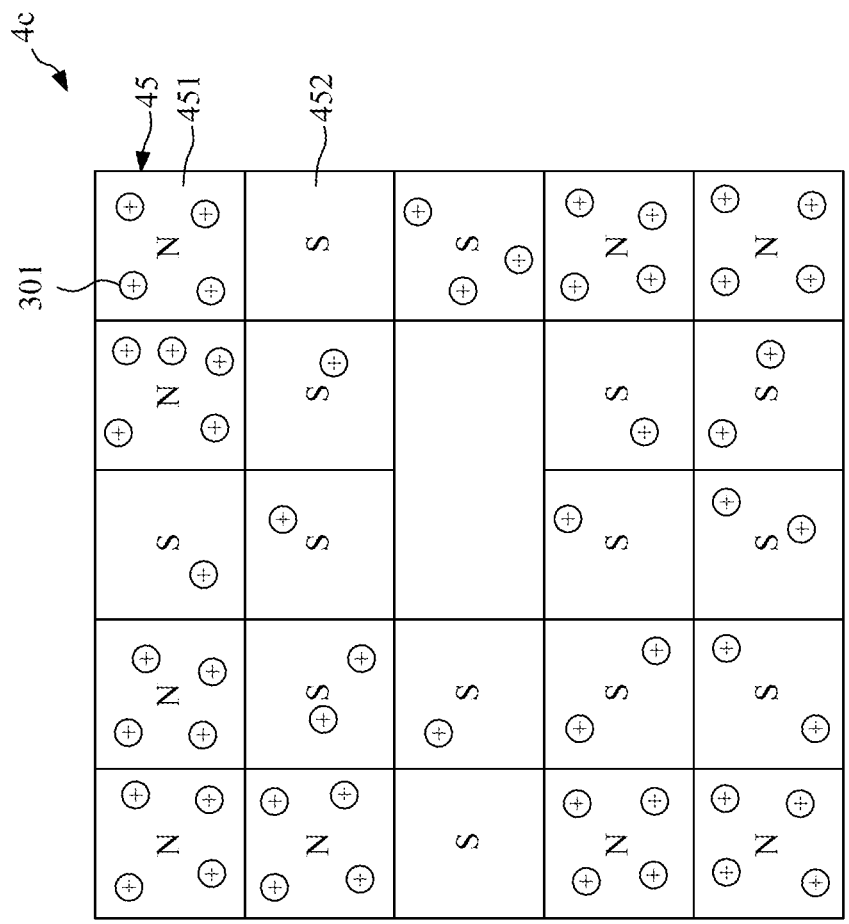
FIG. 11 illustrates a front view of the deposition control apparatus of FIG. 10.

FIG. 10 illustrates a cross-sectional view of a plating apparatus 5c according to some embodiments of the present disclosure. FIG. 11 illustrates a front view of the deposition control apparatus 4c of FIG. 10. The plating apparatus 5c of FIG. 10 may be similar to the plating apparatus 5 of FIG. 1, except for a structure of the deposition control apparatus 4c. The deposition control apparatus 4c is an electromagnet apparatus that is disposed adjacent to the substrate 2 on the second electrode 12 (e.g., cathode). The deposition control apparatus 4c may be disposed outside the space between the first electrode 11 (e.g., anode) and the second electrode 12 (e.g., cathode).

The deposition control apparatus 4c may include a plurality of electromagnet units 45 as to to provide a magnetic field. The electromagnet units 45 may include a plurality of N poles 451 and a plurality of S poles 452 in the front view. The N poles 451 may attract more metal ions 301 in electroplating solution 30. The S poles 451 may attract less metal ions 301 in electroplating solution 30. The N poles 451 may be disposed corresponding to the outer portion 22 of the substrate 2, and the S poles 452 may be disposed corresponding to the central portion 21 of the substrate 2. By applying the magnetic field of the deposition control apparatus 4c, the deposition rate of the metal ions 301 in electroplating solution 30 may be adjusted. For example, by providing the magnetic field adjacent to the central portion of the substrate 2, the first deposition rate may be reduced or the second deposition rate may be increased. That is, by applying the magnetic field to the substrate 2, the deposition rate of the plurality of metal ions of the electroplating solution 30 on a portion of the substrate 2 may be adjusted.

FIG. 12 through FIG. 20 illustrate a method for manufacturing a semiconductor package structure according to some embodiments of the present disclosure.

Figure 12:
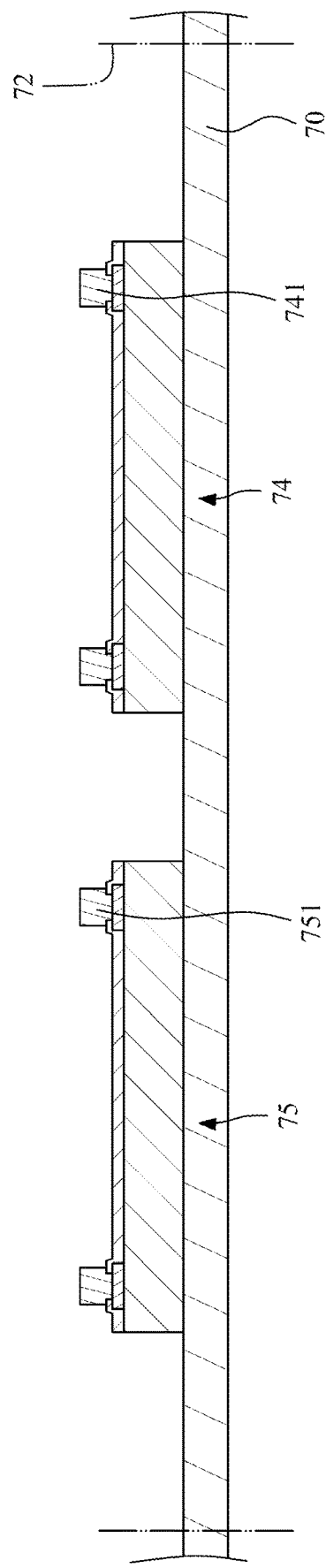
FIG. 12 illustrates one or more stages of an example of a method for manufacturing a package structure according to some embodiments of the present disclosure.

Referring to FIG. 12, a first semiconductor device 74 and a second semiconductor device 75 may be disposed on a carrier 70 side by side. The carrier 70 may be a glass carrier, and may be in a wafer type, a panel type or a strip type. The carrier 70 may have a plurality of cutting lines 72 intersecting with each other and surrounding the first semiconductor device 74 and the second semiconductor device 75. The first semiconductor device 74 may include a plurality of interconnectors 741 (e.g., bumps). The second semiconductor device 75 may include a plurality of interconnectors 751 (e.g., bumps).

Figure 13:
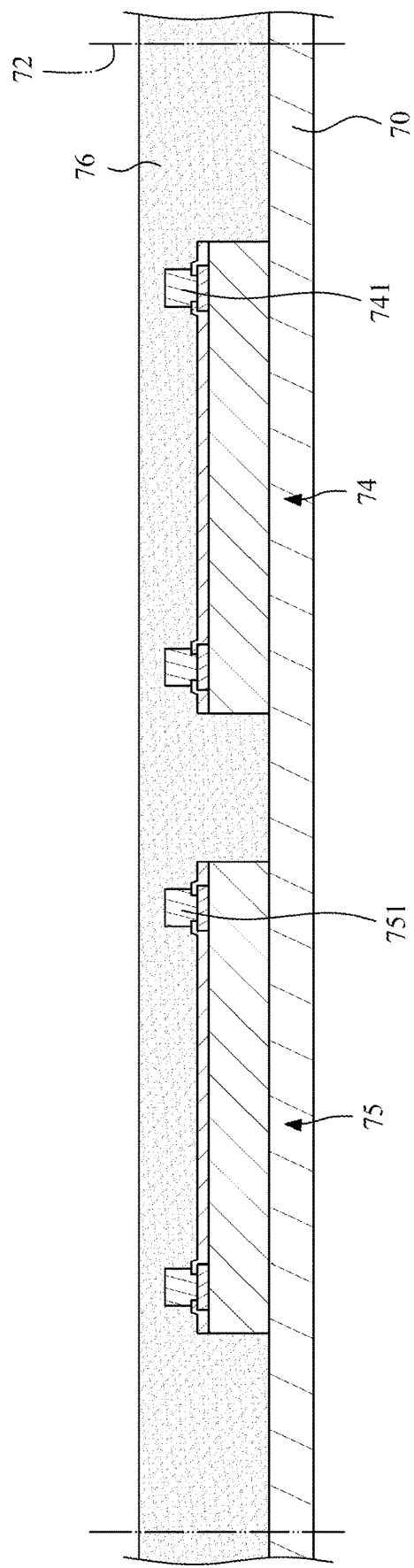
FIG. 13 illustrates one or more stages of an example of a method for manufacturing a package structure according to some embodiments of the present disclosure.

Referring to FIG. 13, the first semiconductor device 74 and the second semiconductor device 75 may be encapsulated by an encapsulant 76.

Figure 14:
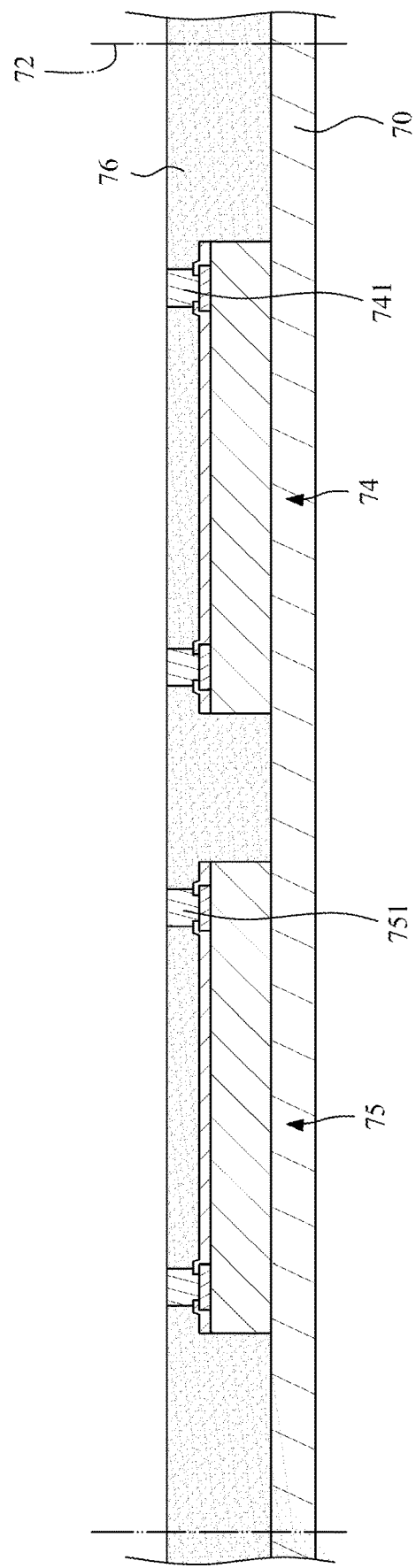
FIG. 14 illustrates one or more stages of an example of a method for manufacturing a package structure according to some embodiments of the present disclosure.

Referring to FIG. 14, the encapsulant 76 may be thinned from its top surface by, for example, grinding. Meanwhile, the interconnectors 741, 751 are exposed from the top surface of the encapsulant 76.

Figure 15:
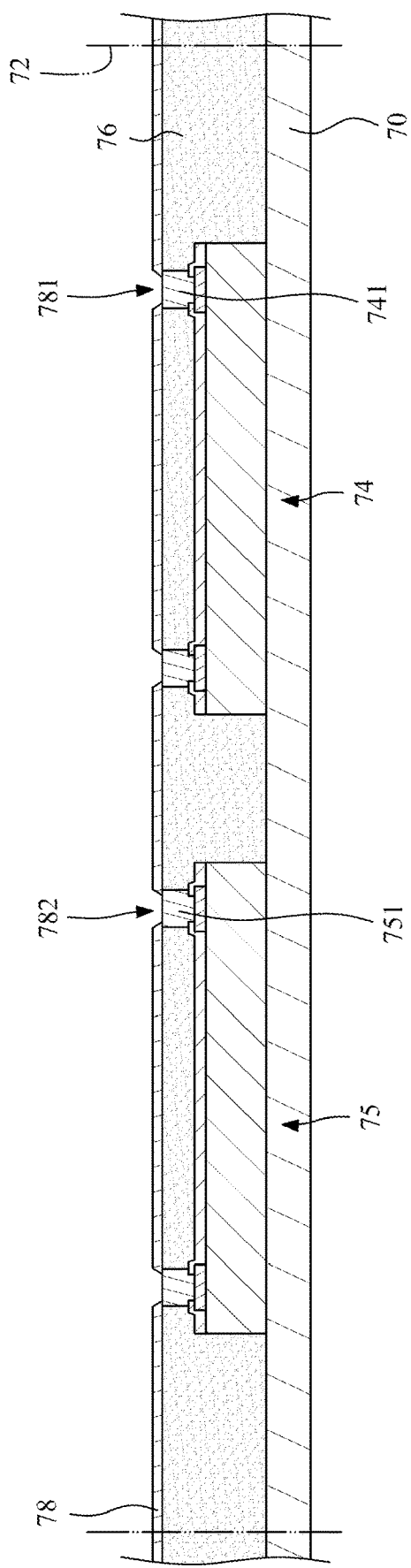
FIG. 15 illustrates one or more stages of an example of a method for manufacturing a package structure according to some embodiments of the present disclosure.

Referring to FIG. 15, a first dielectric layer 78 may be formed or disposed to cover the encapsulant 76. Then, a plurality of openings 781, 782 may be formed in the first dielectric layer 78 to expose the interconnectors 741, 751, respectively.

Figure 16:
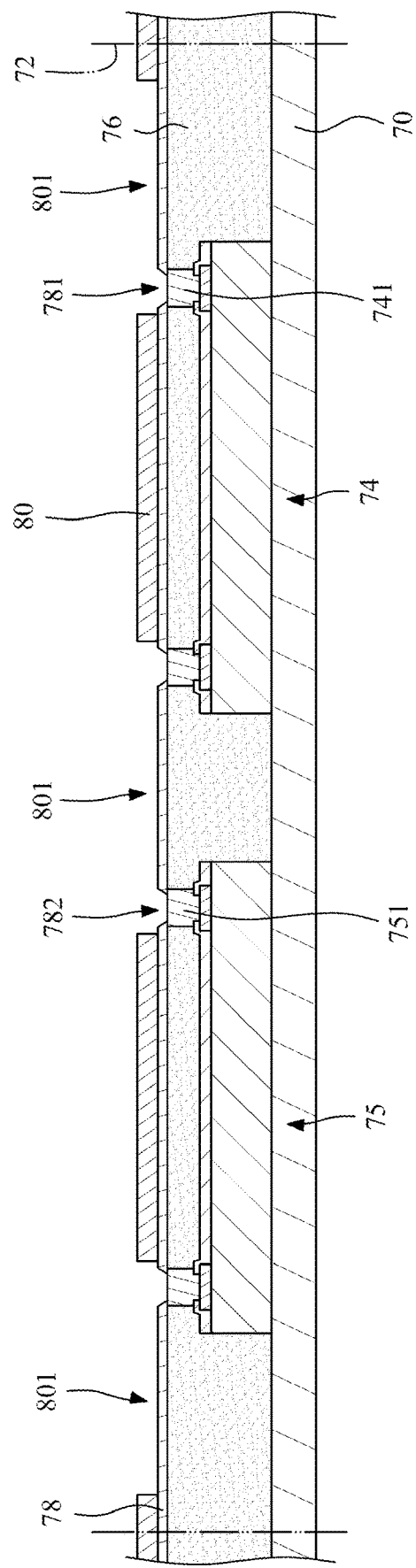
FIG. 16 illustrates one or more stages of an example of a method for manufacturing a package structure according to some embodiments of the present disclosure.

Referring to FIG. 16, a photoresist layer 80 is formed or disposed to cover the first dielectric layer 78. Then, a plurality of openings 801 may be formed in the photoresist layer 80 to expose portions of the first dielectric layer 78 and the openings 781, 782.

Figure 17:
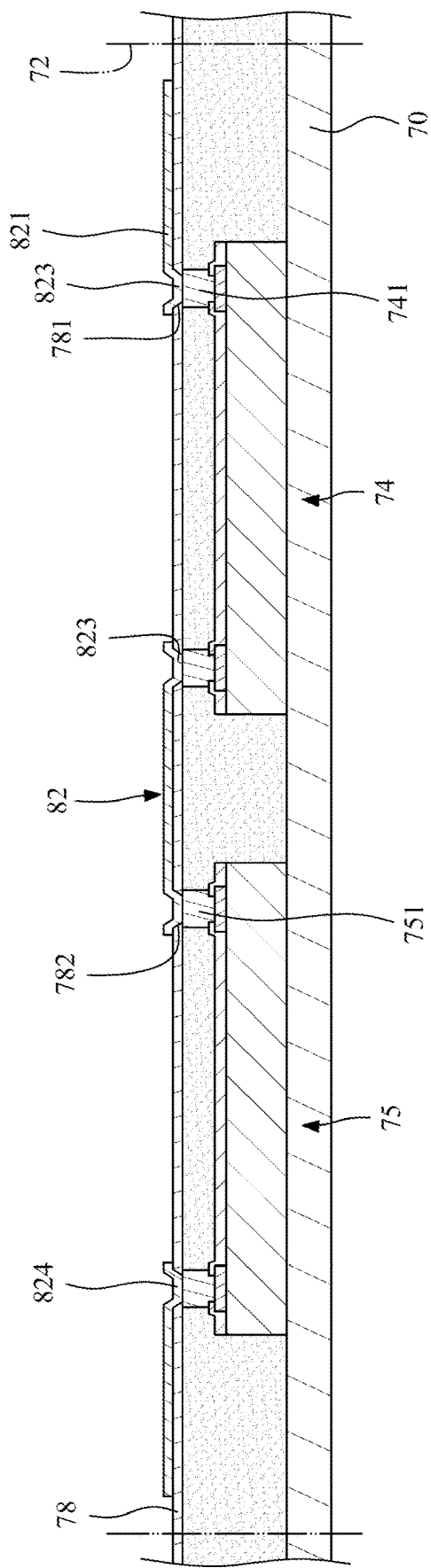
FIG. 17 illustrates one or more stages of an example of a method for manufacturing a package structure according to some embodiments of the present disclosure.

Referring to FIG. 17, a circuit layer 82 is formed or disposed in the openings 801 of the photoresist layer 80 by electroplating as described above. The circuit layer 82 may include a trace portion 821 and a pad portions 823, 824 connecting the interconnectors 741, 751, respectively. Then, the photoresist layer 80 is removed.

Figure 18:
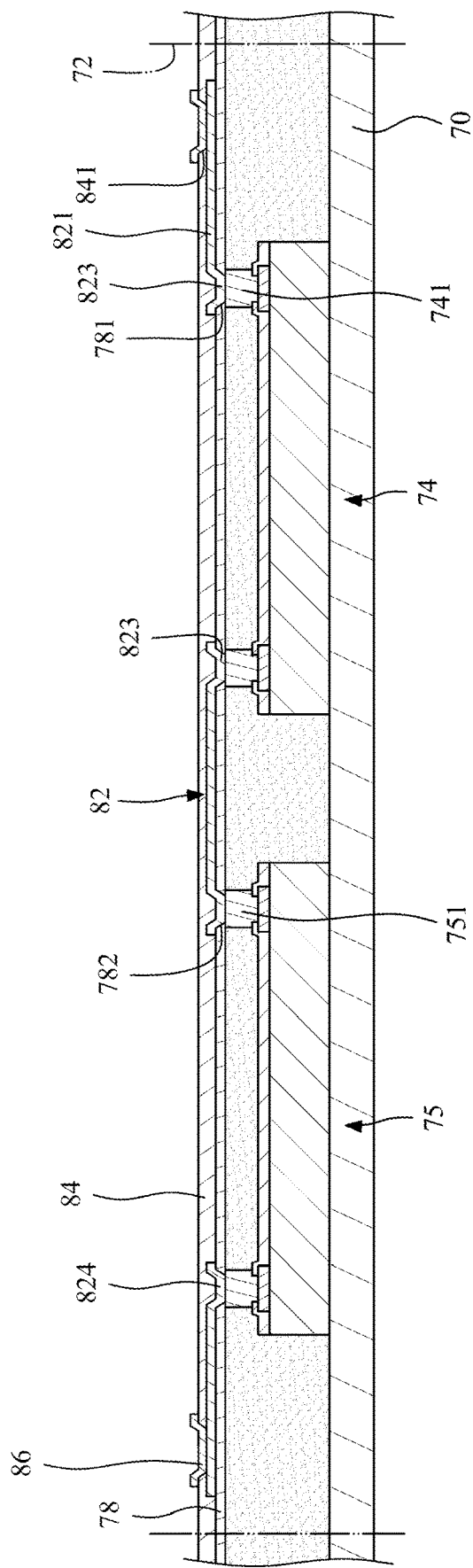
FIG. 18 illustrates one or more stages of an example of a method for manufacturing a package structure according to some embodiments of the present disclosure.

Referring to FIG. 18, a second dielectric layer 84 may be formed or disposed to cover the first dielectric layer 78 and the circuit layer 82. Then, a plurality of openings 841 may be formed in the second dielectric layer 84 to expose a portion of the circuit layer 82. Then, a plurality of UBMs 86 may be formed or disposed in the openings 841 and on the exposed portion of the circuit layer 82.

Figure 19:
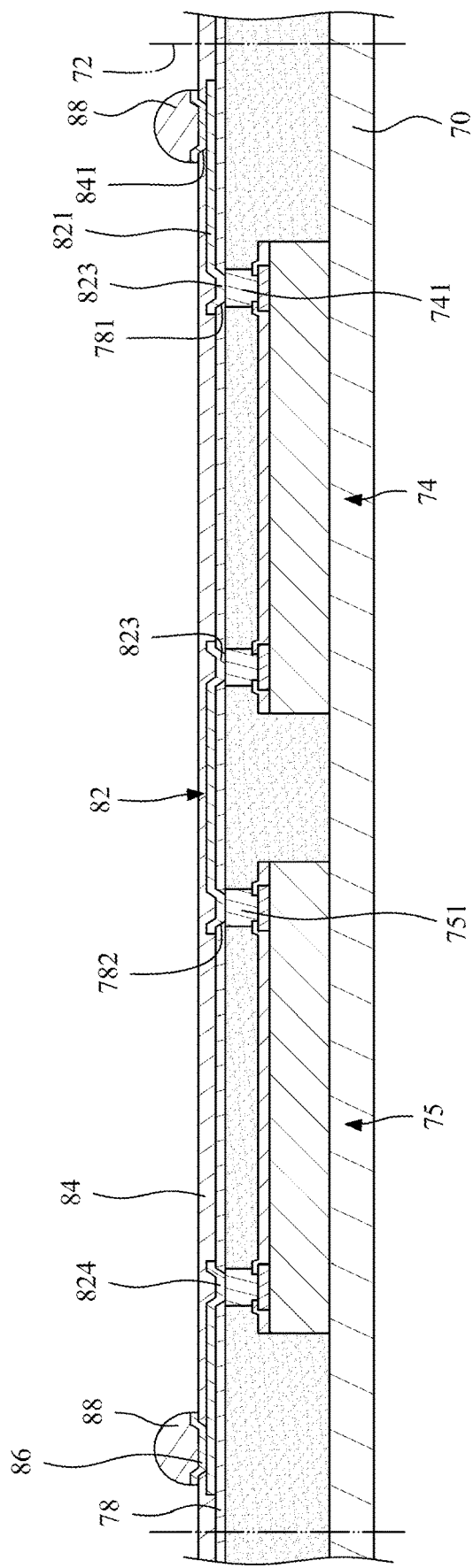
FIG. 19 illustrates one or more stages of an example of a method for manufacturing a package structure according to some embodiments of the present disclosure.
Figure 20:
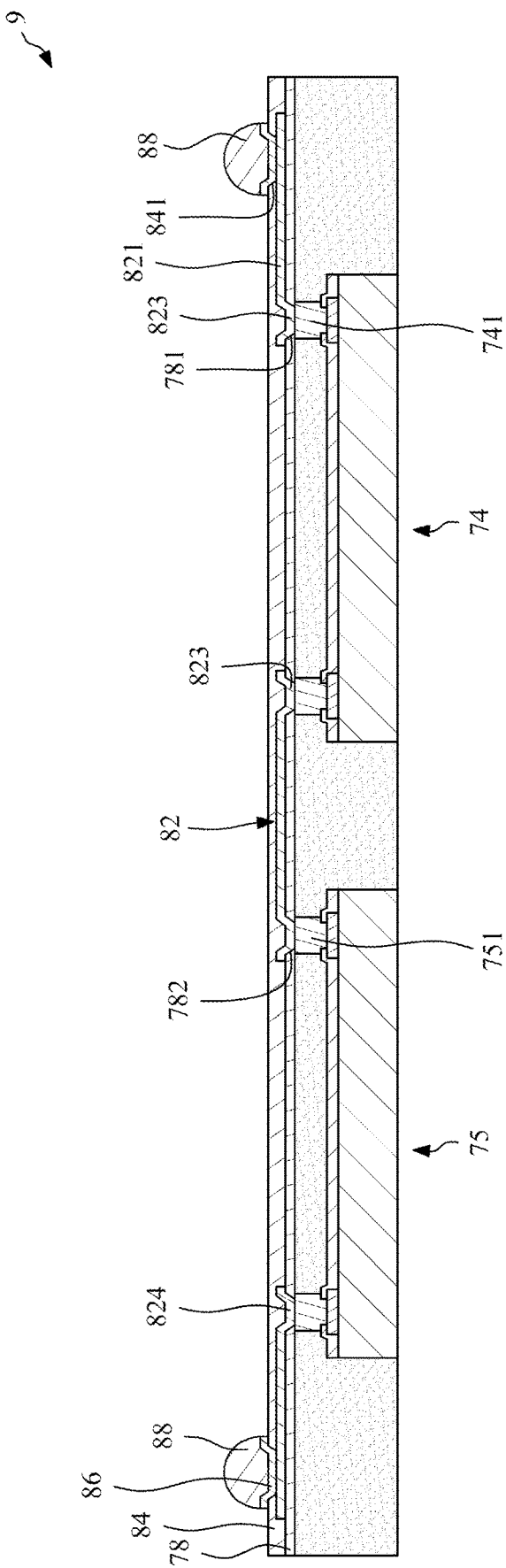
FIG. 20 illustrates one or more stages of an example of a method for manufacturing a package structure according to some embodiments of the present disclosure.

Referring to FIG. 19, a plurality of external connectors 88 may be formed or disposed on the UBMs 86. Then, the carrier 70 is removed. Then, a singulation process is conducted along the cutting lines 72 so as to obtain the semiconductor structure package 9 shown in FIG. 20.

Figure 21:
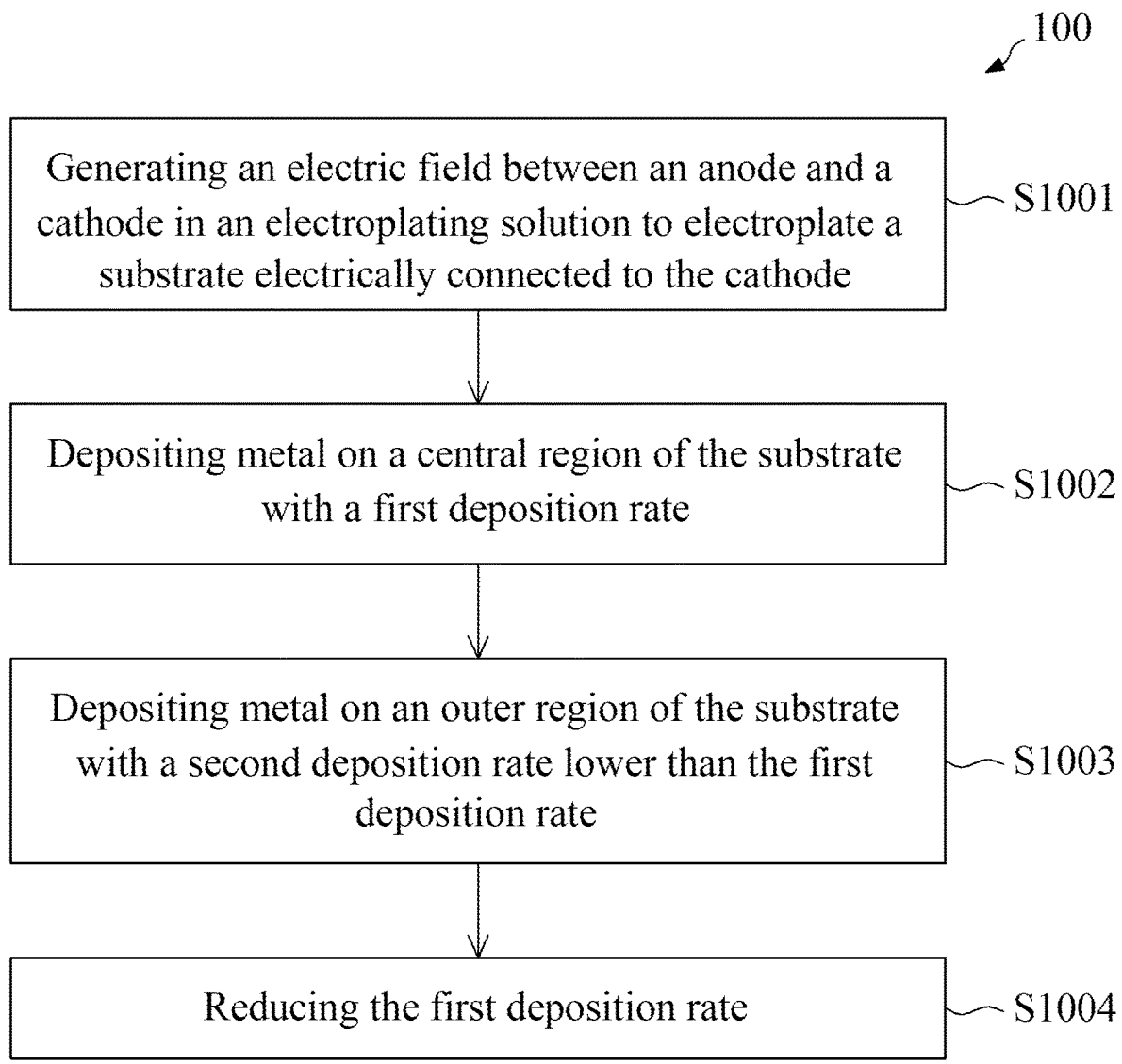
FIG. 21 illustrates a flow chart of a method of manufacturing a package in accordance with some embodiments of the present disclosure.

FIG. 21 illustrates a flow chart of a method 100 of manufacturing a package in accordance with some embodiments of the present disclosure. The package may be a semiconductor structure package such as the semiconductor structure package 9 shown in FIG. 20.

In some embodiments, the method 100 may include a step S1001, generating an electric field between an anode and a cathode in an electroplating solution to electroplate a substrate electrically connected to the cathode. For example, as shown in FIG. 1, generating an electric field between an anode 11 and a cathode 12 in an electroplating solution 30 to electroplate a substrate 2 electrically connected to the cathode 12.

In some embodiments, the method 100 may include a step S1002, depositing metal on a central region of the substrate with a first deposition rate. For example, as shown in FIG. 1, depositing metal on a central region 21 of the substrate 2 with a first deposition rate.

In some embodiments, the method 100 may include a step S1003, depositing metal on an outer region of the substrate with a second deposition rate lower than the first deposition rate. For example, as shown in FIG. 1, depositing metal on an outer region 22 of the substrate 2 with a second deposition rate lower than the first deposition rate.

In some embodiments, the method 100 may include a step S1004, reducing the first deposition rate. For example, as shown in FIG. 1, reducing the first deposition rate.

Figure 22:
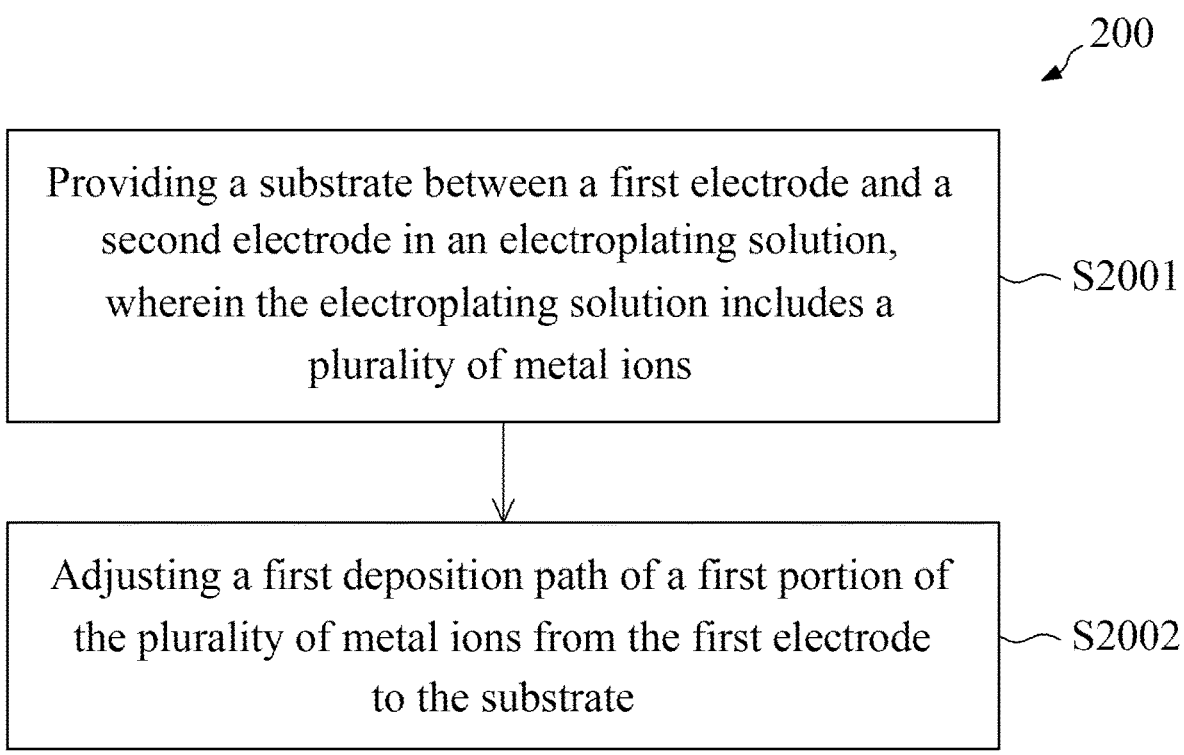
FIG. 22 illustrates a flow chart of a method of manufacturing a package in accordance with some embodiments of the present disclosure.

FIG. 22 illustrates a flow chart of a method 200 of manufacturing a package in accordance with some embodiments of the present disclosure. The package may be a semiconductor structure package such as the semiconductor structure package 9 shown in FIG. 20.

In some embodiments, the method 200 may include a step S2001, providing a substrate between a first electrode and a second electrode in an electroplating solution, wherein the electroplating solution includes a plurality of metal ions. For example, as shown in FIG. 1, providing a substrate 2 between a first electrode 11 and a second electrode 12 in an electroplating solution 30, wherein the electroplating solution 30 includes a plurality of metal ions.

In some embodiments, the method 200 may include a step S2002, adjusting a first deposition path of a first portion of the plurality of metal ions from the first electrode to the substrate. For example, as shown in FIG. 1, adjusting a first deposition path 53 of a first portion 55 of the plurality of metal ions from the first electrode 11 to the substrate 2.

Figure 23:
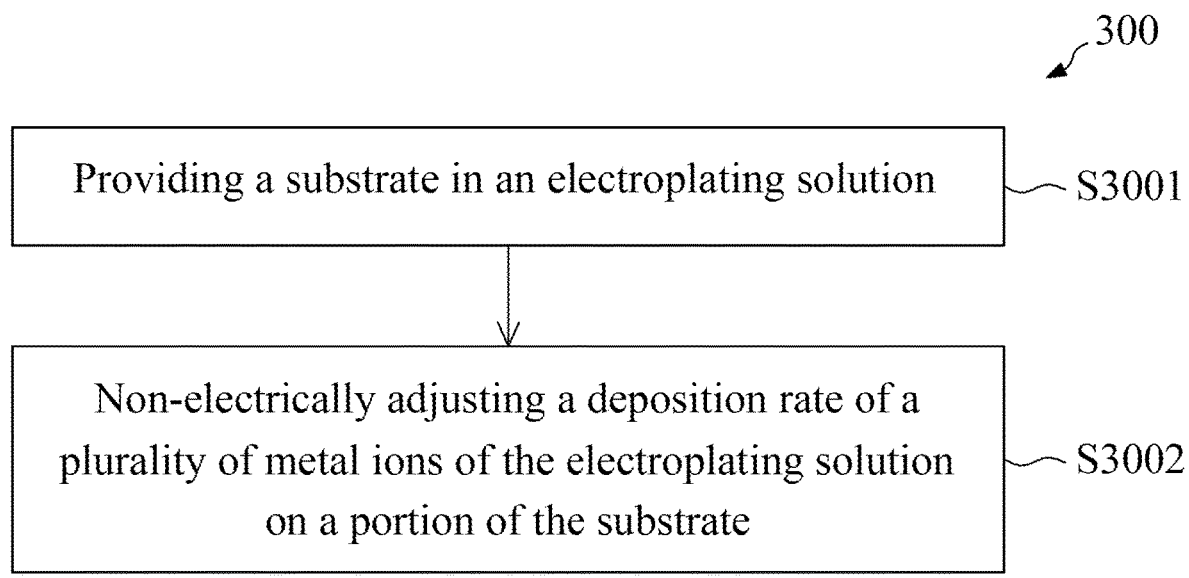
FIG. 23 illustrates a flow chart of a method of manufacturing a package in accordance with some embodiments of the present disclosure.

FIG. 23 illustrates a flow chart of a method 300 of manufacturing a package in accordance with some embodiments of the present disclosure. The package may be a semiconductor structure package such as the semiconductor structure package 9 shown in FIG. 20.

In some embodiments, the method 300 may include a step S3001, providing a substrate in an electroplating solution. For example, as shown in FIG. 1, providing a substrate 2 in an electroplating solution 30.

In some embodiments, the method 300 may include a step S3002, non-electrically adjusting a deposition rate of a plurality of metal ions of the electroplating solution on a portion of the substrate. For example, as shown in FIG. 1, non-electrically adjusting a deposition rate of a plurality of metal ions of the electroplating solution 30 on a portion 21, 22 of the substrate 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a package, comprising:
generating an electric field between an anode and a cathode to electroplate a substrate;
depositing metal on a central region of the substrate with a first deposition rate;
depositing metal on an outer region of the substrate with a second deposition rate lower than the first deposition rate;
providing a barrier between the anode and the substrate, wherein the barrier includes a fan;
adjusting a projection area of the barrier on the substrate; and
depositing metal on the central region of the substrate with a third deposition rate lower than the first deposition rate after generating the electric field.

2. A method for manufacturing a package, comprising:
generating an electric field between an anode and a cathode to electroplate a substrate;
depositing metal on a central region of the substrate with a first deposition rate;
depositing metal on an outer region of the substrate with a second deposition rate lower than the first deposition rate;
providing a barrier between the anode and the substrate;
adjusting a projection area of the barrier on the substrate, wherein adjusting the projection area of the barrier on the substrate includes moving a fan to adjust the projection area of the fan on the substrate; and
depositing metal on the central region of the substrate with a third deposition rate lower than the first deposition rate after generating the electric field.

3. The method of claim 2, wherein moving the fan includes moving the fan by a centrifugal force.

4. The method of claim 2, wherein moving the fan includes rotating a rotatable head connected to the fan to move the fan away from the rotatable head.

5. The method of claim 2, wherein adjusting the projection area of the barrier on the substrate includes driving the barrier by a local flow.

6. A method for manufacturing a package, comprising:
providing a substrate in an electroplating solution;
generating an electric field in the electroplating solution to electroplate the substrate; and non-electrically adjusting a deposition rate of a plurality of metal ions of the electroplating solution on a portion of the substrate after generating the electric field, wherein non-electrically adjusting the deposition rate includes driving a barrier to bar depositing a portion of the plurality of metal ions of the electroplating on the portion of the substrate by a local flow, wherein a flowing direction of the local flow is substantially parallel with a surface of the barrier, wherein the local flow flows upward from a bottom of a tank accommodating the electroplating solution to drive the barrier.

\* \* \* \* \*